US012648475B2

(12) United States Patent
Montmeat et al.

(10) Patent No.: US 12,648,475 B2
(45) Date of Patent: Jun. 2, 2026

(54) SELF-ALIGNING BONDING BY HYDROPHILIC CONTRAST

(71) Applicant: Commissariat à l'Énergie Atomique et aux Énergies Alternatives, Paris (FR)

(72) Inventors: Pierre Montmeat, Grenoble Cedex (FR); Frank Fournel, Grenoble Cedex (FR); Thierry Enot, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 410 days.

(21) Appl. No.: 18/339,548

(22) Filed: Jun. 22, 2023

(65) Prior Publication Data

US 2023/0420408 A1    Dec. 28, 2023

(30) Foreign Application Priority Data

Jun. 28, 2022    (FR) ..................................... 2206445

(51) Int. Cl.
*H01L 21/306* (2006.01)
*H10W 74/01* (2026.01)
*H10W 72/00* (2026.01)

(52) U.S. Cl.
CPC ...... *H10W 74/01* (2026.01); *H10W 72/01338* (2026.01); *H10W 72/01371* (2026.01);
(Continued)

(58) Field of Classification Search
CPC ......... H01L 24/83; H01L 21/56; H01L 24/27; H01L 24/97; H01L 2224/27452;
(Continued)

(56) References Cited

U.S. PATENT DOCUMENTS 5,817,242 A * 10/1998 Biebuyck ................. B41K 1/00
                                                          216/48
6,565,813 B1 * 5/2003 Garyantes ........... B01L 3/50853
                                                          435/288.3
(Continued)

FOREIGN PATENT DOCUMENTS

FR          3 063 832 A1    9/2018
WO    WO 2021/151684 A1    8/2021

OTHER PUBLICATIONS

FR2206445, Feb. 9, 2023, Preliminary Search Report.
(Continued)

*Primary Examiner* — Vu A Vu
(74) *Attorney, Agent, or Firm* — Wolf, Greenfield & Sacks, P.C.

(57)    ABSTRACT

A manufacturing method of a structure intended for assembly with another structure by self-aligning bonding by hydrophilic contrast, including the following successive steps: a) definition of pads on the side of the first face of a first substrate; b) transfer of a second substrate on the side of the first face of the first substrate; c) formation on the sides and/or on a peripheral part of the upper face of the pads, of a material more hydrophobic than a material of the upper face of the pads; and d) removal of the second substrate.

13 Claims, 7 Drawing Sheets

(52) U.S. Cl.
CPC .. *H10W 72/0198* (2026.01); *H10W 72/07311*
(2026.01); *H10W 72/07331* (2026.01)

(58) Field of Classification Search
CPC . H01L 2224/83011; H01L 2224/83896; H01L
2224/97; H01L 2924/36; H01L
2221/6835; H01L 23/3171; H01L
21/02057; H01L 21/306; H01L 21/7806;
H01L 21/568; H01L 21/6835; H01L
21/78; H01L 23/3185; H01L 25/50; H01L
24/80; H01L 2221/68368; H01L
2224/03001; H01L 2224/03002; H01L
2224/03009; H01L 2224/0382; H01L
2224/03823; H01L 2224/03827; H01L
2224/80004; H01L 2224/80007; H01L
2224/80143; H01L 2224/80365; H01L
2224/80379; H01L 2224/83895; H01L
2224/94; H01L 2224/95; H01L
2225/06555; H01L 2924/10156; H01L
24/03; H10D 62/117
USPC ........................................................ 438/107
See application file for complete search history.

(56) References Cited

U.S. PATENT DOCUMENTS

| | | | | |
|---|---|---|---|---|
| 8,274,084 | B2 * | 9/2012 | Daniel | H10K 10/486 |
| | | | | 257/66 |
| 8,283,208 | B2 * | 10/2012 | Koyanagi | H01L 24/29 |
| | | | | 257/E21.705 |
| 8,664,106 | B2 * | 3/2014 | Iwatsu | H01L 24/11 |
| | | | | 438/666 |
| 8,722,513 | B2 * | 5/2014 | Lee | H01L 24/26 |
| | | | | 438/455 |
| 9,519,105 | B1 * | 12/2016 | Shubin | G02B 6/4228 |
| 9,773,741 | B1 * | 9/2017 | Gu | H01L 24/83 |
| 9,871,014 | B2 * | 1/2018 | Haba | H01L 24/05 |
| 11,121,117 | B2 * | 9/2021 | Di Cioccio | H01L 21/68 |
| 11,152,533 | B1 * | 10/2021 | Thompson | H10H 29/14 |
| 11,342,249 | B2 * | 5/2022 | Seki | H01L 23/49513 |
| 11,437,352 | B2 * | 9/2022 | Kim | H10H 20/84 |
| 2010/0248424 | A1 * | 9/2010 | Luce | H01L 25/0657 |
| | | | | 257/E21.705 |
| 2011/0193211 | A1 * | 8/2011 | Chandrasekaran | |
| | | | | H01L 23/3128 |
| | | | | 257/692 |
| 2012/0291950 | A1 * | 11/2012 | Sugiyama | H01L 21/6835 |
| | | | | 156/60 |
| 2013/0140713 | A1 * | 6/2013 | Yu | H01L 24/97 |
| | | | | 257/782 |
| 2013/0273328 | A1 * | 10/2013 | Zheng | H01L 25/50 |
| | | | | 228/256 |
| 2014/0080261 | A1 | 3/2014 | Arase et al. | |
| 2018/0301433 | A1 | 10/2018 | Robin et al. | |
| 2020/0020665 | A1 * | 1/2020 | Di Cioccio | H01L 25/0652 |

OTHER PUBLICATIONS

Preliminary Search Report for French Application No. 2206445, dated Feb. 9, 2023.

Mermoz et al., High density chip-to-wafer integration using self-assembly: on the performances of directly interconnected structures made by direct copper/oxyde bonding. 2013 IEEE 15th Electronics Packaging Technology Conference (EPTC 2013). Dec. 11, 2013:162-7.

* cited by examiner

11

13

11

15          15

19          17
13

11

15          15

19          17
13          23
11
21
20

15

19          25
13          17
11          23
21
20

SELF-ALIGNING BONDING BY HYDROPHILIC CONTRAST

CROSS REFERENCE TO RELATED APPLICATIONS

This application claims priority to French application number 2206445, filed Jun. 28, 2022. The content of this application is incorporated herein by reference in its entirety.

TECHNICAL FIELD

The present disclosure relates generally to the bonding of two structures and more specifically, self-aligning bonding by hydrophilic contrast.

BACKGROUND ART

Self-aligning bonding by hydrophilic contrast consists in bonding two structures whose alignment is controlled by a droplet of water deposited on one of the two structures. In such bonding, a droplet of water is deposited on the surface of the first structure having generally a more hydrophilic zone, the droplet of water being confined to this zone by a difference in hydrophilicity. The second structure presented, also having a more hydrophilic zone, aligns itself with the first structure by traction of the water droplet in such a way that the hydrophilic zone of the second structure faces the hydrophilic zone of the first structure.

There is a need for improvement in self-aligning bonding processes and more particularly in the manufacture of structures intended for such bonding.

SUMMARY OF INVENTION

An embodiment provides for a manufacturing process designed for assembly with another structure by self-aligning bonding by hydrophilic contrast, comprised of the following successive steps:

definition of pads on the side of a first face of a first substrate;

transfer of a second substrate to the side of the first face of the first substrate;

formation on the sides and/or on a peripheral part of the upper face of the pads, of a material more hydrophobic than a material of the upper face of the pads; and removal of the second substrate.

According to an embodiment, the material of the upper face of the pads and the coating on the side of the pads have a difference in water droplet contact angle greater than 20°.

According to an embodiment, the first substrate comprises a semiconductor material.

According to an embodiment, the first substrate is a substrate of the semiconductor on insulator type.

According to an embodiment, the first face of the first substrate is coated with a layer of oxide.

According to an embodiment, the oxide layer on the first substrate comprises pads for metallic connections.

According to an embodiment, at step b), the second substrate is fixed to the first substrate by molecular bonding.

According to an embodiment, step c) is carried out by HF vapor treatment.

According to an embodiment, step c) is carried out by immersing the structure in a bath based on a fluorinated compound.

According to an embodiment, step c) is carried out by immersing the structure in a bath based on the mixture known commercially as Optool, based on octadecyltrichlorosilane or based on perfluorodecyldimethylchlorosilane.

According to an embodiment, the process comprises, before step c), a step of cutting the first substrate to form chips, each chip comprising a pad.

According to an embodiment, the process comprises, after step a), a step of cleaning the first face of the first substrate.

According to an embodiment, the second substrate is structured in such a way as to have a pad of non-zero thickness in line with each pad on the first substrate.

According to an embodiment, the pads of the first substrate have non-zero thickness.

Another embodiment provides a bonding process of a first structure and a second structure, made by the process defined above, the bonding process comprising a step of depositing a droplet of water on the first face of the first substrate of the first structure and a step of transferring the second structure to the first structure, the first faces of the first substrates facing each other.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various Figures. In particular, the structural and/or functional features that are common among the various embodiments may have the same references and may dispose of identical structural, dimensional and material properties.

For the sake of clarity, only the operations and elements that are useful for an understanding of the embodiments described herein have been illustrated and described in detail. In particular, only the shaping of the structures has been described. The functionalities of these structures have not been described.

In the following disclosure, unless specified otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation represented in the Figures.

Unless specified otherwise, the expressions "around", "approximately", "substantially" and "in the order of" signify within 10%, and preferably within 5%.

Throughout the rest of this description, a layer is said to be hydrophilic when the measured angle of a droplet or angle of contact, i.e. the angle formed between the tangent to the droplet and the surface of the layer, for a droplet of water, is less than 60°, preferably less than 30°. Furthermore, a layer is said to be hydrophobic when the measured angle of a droplet, for a droplet of water, is greater than 60°, for example greater than 70°. Furthermore, a layer is said to be more hydrophilic or less hydrophobic than another layer when the angle of contact of a droplet of water on the surface of the layer is less than the angle of contact of a droplet of water on the surface of the other layer.

FIG. 1A, FIG. 1B, FIG. 1C, FIG. 1D, FIG. 1E, FIG. 1F, FIG. 1G and FIG. 1H are cross sectional views, partially and schematically illustrating the successive steps of an example of a manufacturing process followed by assembly of the two structures by bonding.

Figure 1A:
FIG. 1A, FIG. 1B, FIG. 1C, FIG. 1D, FIG. 1E, FIG. 1F, FIG. 1G and FIG. 1H are cross sectional views, partially and schematically illustrating the successive steps of an example of a manufacturing process followed by assembly of two structures by bonding.

FIG. 1A illustrates a starting substrate 11. As an example, substrate 11 is of a semiconductor material. As an example, substrate 11 is of silicon, for example monocrystalline.

Substrate 11 correspond for example to a wafer, for example generally circular in shape with a diameter between 100 mm and 300 mm, for example of the order of 200 mm or it may be a portion of wafer. As an example, substrate 11 has a thickness between 100 µm and 1 mm, for example between 500 µm and 800 µm, for example of the order of 725 µm.

As an example, circuits or integrated elements are formed in and/or on substrate 11, for example on the upper face of substrate 11. As an example, substrate 11 may comprise, on the side of its upper face, a stack of one or more dielectric levels and one or more electrically conducting levels, for example metallic, alternating, forming a stack of interconnections (not detailed in the Figure) in which integrated circuit connection elements are formed in and/or on substrate 11.

Figure 1B:
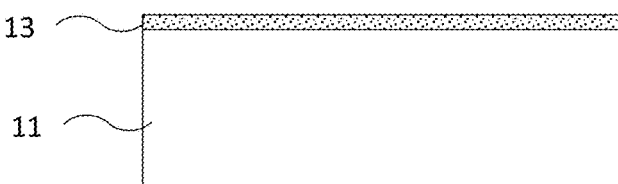

FIG. 1B illustrates a structure obtained at the end of a step of depositing a layer of insulator 13 on the upper face of substrate 11 illustrated in FIG. 1A. As an example, layer 13 is an oxide, for example silicon dioxide ($SiO_2$).

As an example, layer 13 is formed, for example, by chemical deposition in the vapor phase (CVD, chemical vapor deposition) from silane ($SiH_4$). As an example, the deposition is followed by curing at high temperature, for example at a temperature higher than 400° C.

After deposition, layer 13 is, for example, planarized, for example, by mechanical or chemical mechanical planarizing (CMP, Chemical Mechanical Polishing). As an example, layer 13 has, after planarizing, a thickness between 100 nm and 3 µm, for example of the order of 2 µm. Layer 13 extends for example continuously and with a substantially uniform thickness over the entire upper surface of substrate 11.

In a variant, layer 13 contains a plurality of metallic patterns, for example in copper, separated laterally by an insulating material, for example an oxide, for example silicon dioxide. As an example, the patterns correspond to pads, for example on a surface area between 1 $\mu m^2$ and 625 $\mu m^2$, for example of the order of 10 $\mu m^2$. As an example, two neighboring patterns are spaced by a distance between 1 µm and 30 µm, for example of the order of 3 µm. In this variant, the surface of layer 13 is then a hybrid metal and oxide surface, for example copper and silicon oxide.

In the rest of the description, by front face is meant the upper face of the structure in the orientation of FIG. 1B and by back face, the lower face of the structure in the orientation of FIG. 1B.

Figure 1C:
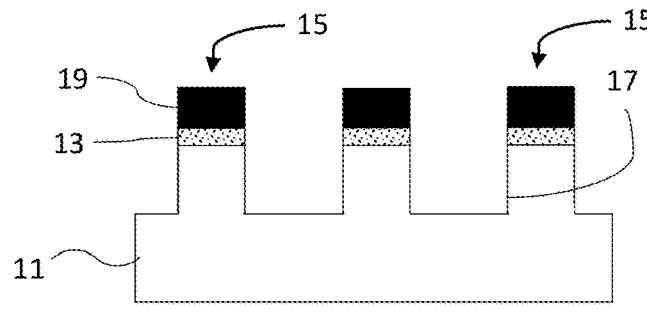

FIG. 1c illustrates a structure obtained at the end of a trench-forming step 17 in the structure of FIG. 1B, laterally delimiting the pads 15. The trenches 17 are, for example, formed by etching. To do this, a layer of photosensitive resin 19 is, for example, deposited on the upper face of layer 13. Layer 19 is then exposed to ultraviolet (UVs) light locally through a photolithographic mask, then developed to form the patterns in layer 19. As an example, the resin of layer 19 is a positive or negative resin. At the end of this step, only portions of layer 19 remain in line with the pads 15 to be formed. An etching step can then be used to form openings or trenches 17, on the upper face of the structure in layer 13 and substrate 11, using the patterns previously formed in layer 19 as etching mask. The trenches 17 are, for example, non-traversing, i.e. they do not extend to the lower face of substrate 11. The pads 15, are, for example, formed from layer 19, layer 13 and part of substrate 11.

As an example, if substrate 11 comprises integrated electronic circuits, each pad 15 comprises a circuit. The width of the pads 15 is then greater than the width of the integrated circuits. The pads 15 are, for example, all identical within process variations.

As an example, several dozen pads 15 are formed in a single plate of substrate 11. As an example, each pad 15 has a surface area between 1 $mm^2$ and 1,600 $mm^2$, for example between 9 $mm^2$ and 900 $mm^2$, for example of the order of 3 mm×3 mm or 8 mm×8 mm.

The trenches 17 extend, for example, over a depth, from the upper face of substrate 11, of between 1 µm and 50 µm, for example between 1 µm and 30 µm, for example between 5 µm and 15 µm.

As an example, during the formation step of pads 15, if layer 13 corresponds to a hybrid metal-oxide layer, several successive etches can be provided to form the trenches 17. As an example, after the formation of layer 19, in line with pads 15 to be formed, a first etch, for example wet, removes the metallic patterns not protected by layer 19, then a second etch, for example by plasma, removes the oxide and part of the thickness of substrate 11 not protected by layer 19.

Figure 1D:
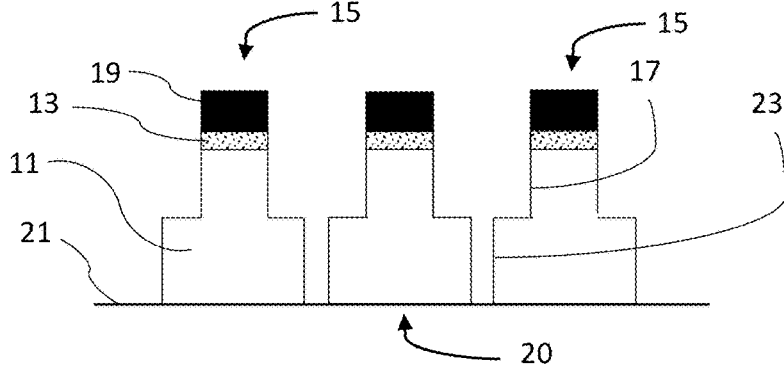

FIG. 1D illustrates a structure obtained at the end of a cutting step of the structure illustrated in FIG. 1C so as to form individual chips 20. Before the cutting step, the structure illustrated in FIG. 1C is, for example, mounted on a supporting film 21, for example an adhesive film, itself stretched on a rigid frame (not visible in the Figure). In this example, the substrate 11 is fixed, by its back face, to an upper face of the supporting film 21. The cutting step is, for example, carried out with a diamond tipped saw. During this step, trenches 23 are formed in the structure illustrated in FIG. 1C, in line with the trenches 17. Trenches 23 are, for example, traversing and extend, for example, from the bottom of trenches 17 up to the lower face of substrate 11. The trenches 23 are for example centred on the overlying trenches 17. As an example, the trenches 23 have a width less than the width of trenches 17.

As an example, the trenches 23 are formed so as to form chips 20, each chip 20 containing a single pad 15.

Figure 1E:
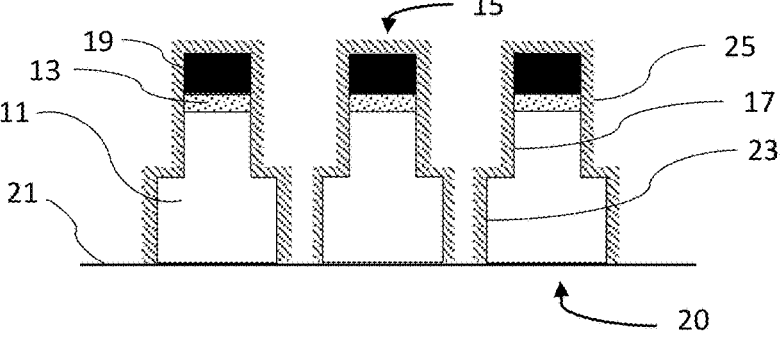

FIG. 1E illustrates a structure obtained at the end of a step of depositing a hydrophobic layer 25 on the upper face of the structure illustrated in FIG. 1D.

The deposition step is, for example, followed by curing, for example to crosslink and stabilize the hydrophobic compound.

After the deposition step, layer 25 covers the upper face of the structure illustrated in FIG. 1D, i.e. the upper face of layer 19, the upper face of the film 21, the sides of layer 13 and the sides of substrate 11 in trenches 17 and 23.

Figure 1F:
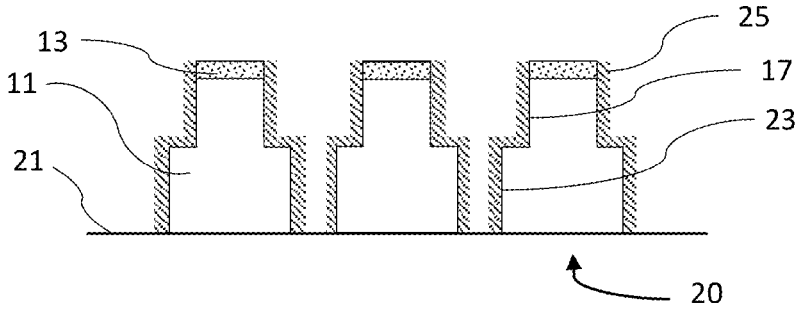

FIG. 1F illustrates a structure obtained at the end of a step of removing layer 19 from the structure illustrated in FIG. 1E. During this step, layer 19 is entirely removed from the structure, for example by chemically or plasma process.

The removal of layer 19 entails the removal of the portion of layer 25 located vertically in line with layer 19. The removal step is, for example, followed by a cleaning step of the surface of pads 15 and more specifically the upper face of layer 13. Indeed, particles or organic contaminants from layer 19 may remain, after the step of removing layer 19, on the upper face of layer 13. These contaminants may have a negative effect on subsequent bonding or on the steps following bonding.

At the end of this step of removing layer 19, layer 25 remains on the sides of the chips 20, i.e. on the sides of substrate 11 and of layer 13 and on the upper face of the frame 21. Thus, the sides of the chips 20 and the upper face of layer 13 have a difference in hydrophilicity. Indeed, the material of layer 25 is chosen to be more hydrophobic than the material(s) of the upper face of layer 13, for example hydrophilic.

As an example, after this step, the chips 20 are detached from the supporting film 21. As an example, the chips 20 are removed individually or collectively from the supporting film 21 for assembly on a new structure.

Figure 1G:
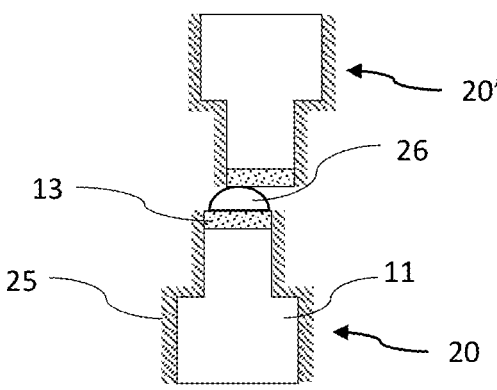

FIG. 1G illustrates a structure obtained at the end of a step of depositing a droplet of water 26 on the surface of a chip 20 formed by the process described above relating to FIGS. 1A to 1F, and the transfer to another structure with a host surface having a hydrophilicity contrast similar to that at the front face of the chip 20. As an example, the chip 20 is transferred to another chip 20', itself formed by a process identical or similar to the process of FIGS. 1A to 1F, with layers 13 of the two chips facing each other.

The difference in hydrophilicity between the front face and the sides of the chips 20 allows the water droplet 26 to be confined on the front face of the chips 20 which is more hydrophilic than the sides. During the transfer of the chip 20', it is attracted, more specifically the front face of the chip 20' is attracted, by the water droplet 26 and the two chips 20 self-align by capillarity.

As an example, the chips can be manipulated individually, for example with chip manipulating tools (pick and place) and/or collectively using chip carrier trays.

Figure 1H:
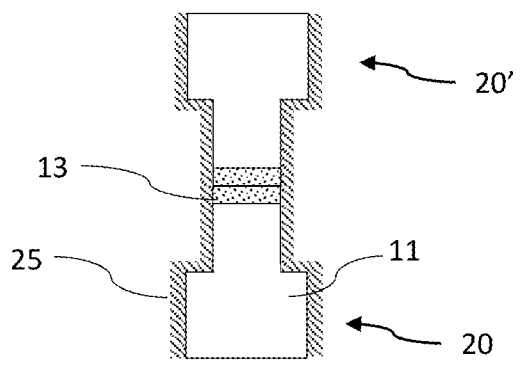

FIG. 1H illustrates a final structure of two chips assembled by bonding. As an example, the transfer step illustrated in FIG. 1G is followed by a step of curing or evaporation of the water droplet 26.

The bonding between structures 20 and 20' is for example direct bonding (without the application of adhesive material), also called molecular bonding, of the front face of structure 20 to the front face of structure 20'. The bonding can be direct bonding of dielectric to dielectric, or hybrid metal-dielectric to metal-dielectric bonding. As a variant, the bonding can be direct metal-metal bonding.

The process as described in FIGS. 1A to 1G enables structures to be assembled with very high precision and without the use of an aligning device.

However, it has been observed that the removal of layer 19 requires the use of aggressive cleaning methods which can result in damage to the hydrophobic layer 25 on at least the upper part (in the orientation of FIG. 1F) of the sides of the chips 20.

Furthermore, the step of separating the chips by cutting with a diamond tipped saw described with reference to FIG. 1D can cause metallic and particle contamination of the structure.

In the embodiments described hereafter, it is envisaged to produce structures for assembly by self-aligning bonding by hydrophilic contrast, protecting the front face of the structures during the step of deposition the hydrophobic layer with a plate of a substrate.

FIG. 2A, FIG. 2B, FIG. 2C, FIG. 2D, FIG. 2E, FIG. 2F, FIG. 2G and FIG. 2H are cross sectional views, partially and schematically illustrating the successive steps of an example of a manufacturing process followed by assembly of the two structures by bonding according to a first embodiment.

The process described in FIGS. 2A to 2H comprises steps similar to some of the steps in the process described in FIGS. 1A to 1H. These steps will not be detailed again in what follows. Only differences from the process of FIGS. 1A to 1H will be highlighted.

Figure 2A:
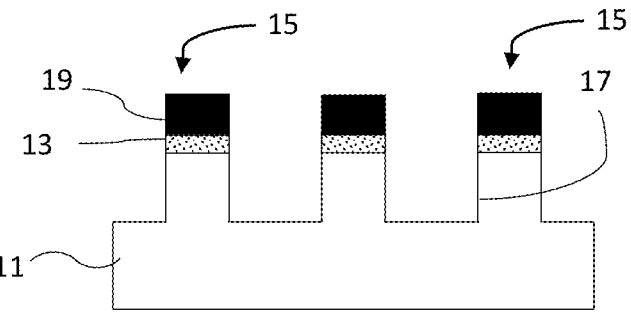
FIG. 2A, FIG. 2B, FIG. 2C, FIG. 2D, FIG. 2E, FIG. 2F, FIG. 2G and FIG. 2H are cross sectional views, partially and schematically illustrating the successive steps of an example of a manufacturing process followed by assembly of two structures by bonding according to a first embodiment.
Figure 2B:
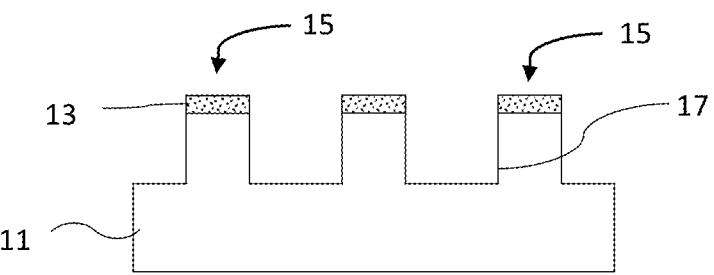

Starting from the structure illustrated in FIG. 2A, obtained by steps identical to steps 1A to 1C but not shown again, the process comprises a step of removing the layer 19 so as to form the structure illustrated in FIG. 2B. In an embodiment, the step of removing the layer 19 then follows the step of forming the trenches 17. In particular, layer 19 is removed before depositing the hydrophobic layer.

During this step, layer 19 is removed and the surface of layer 13, for example, is cleaned. As an example, the surface of layer 13 is, for example, cleaned with a dry or wet chemical solution.

As an example, the surface of layer 13 is cleaned by the so-called RCA method.

In a variant, the surface of layer 13 is cleaned using a sulfuric peroxide mixture composed of sulfuric acid and hydrogen peroxide, for example respectively in a proportion of five to one. In this variant, the surface of layer 13 is rinsed then cleaned again using a mixture, for example at 70° C., composed of water, ammonia and hydrogen peroxide, for example respectively in a proportion of five to one to one.

In another variant, the surface of layer 13 is cleaned using a mixture known commercially as EKC PCMP5650. In this variant, layer 13 is cleaned under UV and/or ozone.

Other cleaning processes can be used. In particular, at this stage as long as there is no hydrophobic layer to protect, numerous cleaning processes may be envisaged.

At the end of this step, the upper face of the pads 15 and more specifically the upper face of layer 13, is free of any residues from layer 19. In this embodiment, the only purpose of layer 19 is to be a mask for etching the trenches 17 unlike the example described in FIGS. 1A to 1H in which the purpose of layer 19 is also to protect the upper face of layer 13 while the hydrophobic layer 25 is deposited.

Figure 2C:
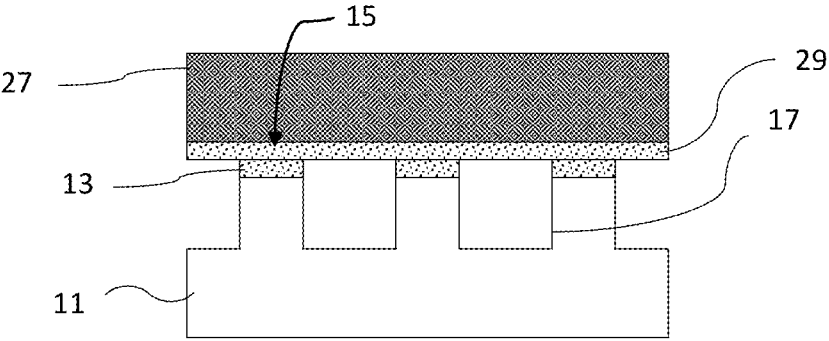

FIG. 2C illustrates a structure obtained at the end of a step of transferring a substrate 27 to the upper face of the structure illustrated in FIG. 2B. As an example, substrate 27 is coated with a layer 29 on the lower face in the orientation of FIG. 2C, called the front face. As an example, substrate 27 is a semiconductor substrate, for example silicon. As an example, substrate 27 is a plate of the same diameter as substrate 11. As an example, substrate 27 has a thickness greater than 100 μm, preferably greater than 200 μm, for example between 200 μm and 1 mm, for example between 500 μm and 800 μm, for example of the order of 725 μm. As an example, layer 29 is in the same material as layer 13. Layer 29 is, for example, of an oxide, for example silicon dioxide. Layer 29 has, for example, a thickness between 200 nm and 10 μm, for example of the order of 1 μm. Layer 29 is, for example, formed full plate, on the entire surface of substrate 27. As an example, before transferring substrate 27 and layer 29 to the structure illustrated in FIG. 2B, the lower face of layer 29, in the orientation of FIG. 2C, i.e. the face of layer 29 opposite substrate 27, is cleaned by a process identical to that used for cleaning the upper face of layer 13.

The transfer of substrate 27 to the upper face of the structure illustrated in FIG. 2B is carried out in such a way that layer 29 is in direct contact with layer 13. As an example, the bonding used in this step is direct bonding or molecular bonding of the upper face of layer 13 to the lower face of layer 29.

In this example, substrate 27 is unstructured, i.e. the lower face of substrate 27 and the lower face of layer 29 are flat and extend continuously over the entire surface of substrate 11. At the end of this step, substrate 27 and layer 29 extend over the pads 15 and above the trenches 17.

Figure 2D:
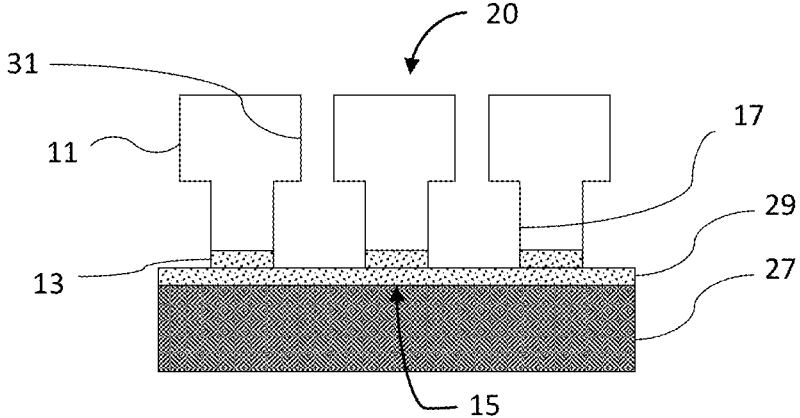

FIG. 2D illustrates a structure obtained at the end of a step to form individual chips 20 by cutting or etching the structure illustrated in FIG. 2C. In FIG. 2D, the structure is represented returned with respect to the structure illustrated in FIG. 2C. The front face of the structure illustrated in FIG. 2C is then the lower face of the structure illustrated in FIG. 2D.

During this step, substrate 11 is formed from the upper face (back face) of the substrate, trenches 31, in line with trenches 17. Trenches 31 are, for example, traversing and extend, for example, from the upper face (back face) of substrate 11 to the bottom of trenches 17. Trenches 31 are, for example, centred on the overlying trenches 17. As an example, trenches 31 have a width less than the width of trenches 17. As an example, trenches 31 are formed so as to form chips 20, each chip 20 comprising a single pad 15.

Trenches 31 are, for example, made using a diamond saw. In a preferred embodiment, the trenches 31 are made by plasma etching, which avoids the metallic and particle contamination related to the use of diamond saws. Other cutting processes can be used, for example laser cutting.

Figure 2E:
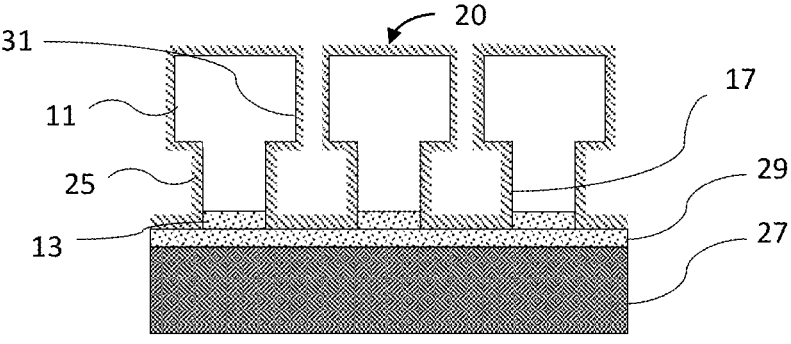

FIG. 2E illustrates a structure obtained at the end of a step of depositing a hydrophobic layer 25 on the back face of the structure illustrated in FIG. 2D, i.e. the upper face of the structure illustrated in FIG. 2E. This step is similar to the deposition step described in relation to FIG. 1E but differing in that the deposition is realised by the back face of the chips 20.

Layer 25 is, for example, formed by vapor phase deposition, by spin coating a liquid or by deposition by immersion in a bath. As an example, according to the method of deposition and the nature of the material of layer 25, the structure is cured.

As an example, substrate 25 is a fluorinated compound. Layer 25 is, for example, formed from a solution based on a fluorinated compound known commercially as NOVEC 1720. In this example, the deposition can be assisted by ultrasonic activation. In this example, layer 25 is, after deposition, cured, for example at 135° C. for 15 minutes.

In a variant, layer 25 is formed from a solution developed by the manufacturer Daikin and known commercially as optool. In this example, layer 25 is dried by centrifuging.

In another variant, layer 25 is formed from octadecyl-trichlorosilane(OTS) in solution in isooctane. In this example, layer 25 is dried by centrifuging.

In another variant, layer 25 is formed from perfluoro-decyldimethylchlorosilane in solution in isooctane. In this example, layer 25 is dried by centrifuging.

More generally, layer 25 is formed by deposition, that is to say by adding, for example by grafting, a hydrophobic material onto the exposed parts of the structure, while substrate 27 is mechanically secured to substrate 11. The hydrophobic material comprises one or more compounds of the solution, liquid or gaseous, circulating between the pads during the deposition step.

During this step, layer 25 is deposited over the entire upper face of the structure illustrated in FIG. 2D and covers the back face of substrate 11, the sides of substrate 11 and layer 13 and the portions of the upper face of layer 29 not covered by the pads 15.

As an example, the individualisation steps of the chips 20 and deposition step of the layer 25 can be inverted. Thus, layer 25 is deposited while the trenches 31 are not formed, layer 25 then covering the sides and bottom of the trenches 17 and the portions of the upper face of layer 29 not covered by the pads 15, but not covering the sides of the trenches 31.

Figure 2F:
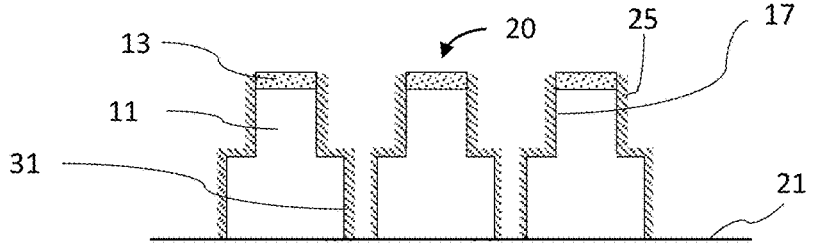

FIG. 2F illustrates a structure obtained at the end of a step of transferring the structure illustrated in FIG. 2E on a supporting film 21, then removing substrate 27 and layer 29.

In FIG. 2F, the structure is represented returned with respect to the structure illustrated in FIG. 2E. In FIG. 2D, the front face of the structure is then the upper face. As an example, the structure is fixed by its back face to the upper face of the supporting film 21. In other words, in this example, the chips 20 are fixed by their back face (lower face of substrate 11) to the upper face of the supporting film 21.

Substrate 27 and layer 29 are, for example, detached or debonded mechanically from the rest of the structure. To facilitate the removal of substrate 27 and layer 29, the supporting film 21 is, for example, mounted on a suction table. As an example, the film 21 is chosen such that the force of adhesion of the chips 20 to the film 21 is greater than the force of adhesion of substrate 27 and layer 29 to the chips 20.

To detach substrate 27 and layer 29, other known detachment techniques may be used, such as laser lift-off (LLO), Smart Cut (fracturing an implanted embedded layer), chemical etching or mechanical abrasion of the substrate.

At the end of the step described above, each chip 20 has a difference in hydrophilicity between its sides and its front face. The sides of the chips 20 are covered with a hydrophobic layer whose droplet angle, for a water droplet, is, for example, greater than 60°. The front faces of the chips 20 comprise a layer 13 whose surface is, for example, hydrophilic and have a droplet angle, for water droplet, for example, less than 40°.

As an example, when layer 25 is in NOVEC 1720, layer 25 has a droplet angle, for a water droplet, of the order of 105°.

In a variant, when layer 25 is formed by HF vapor, layer 25 has a droplet angle, for a water droplet, of the order of 70°.

In another variant, when layer 25 is in optool, layer 25 has a droplet angle, for a water droplet, of the order of 107°.

In another variant, when layer 25 is in OTS, layer 25 has a droplet angle, for a water droplet, of the order of 110°.

In another variant, when layer 25 is in perfluorodecyldimethylchlorosilane, layer 25 has a droplet angle, for a water droplet, of the order of 110°.

As an example, the surface of layer 13 has a droplet angle, for a water droplet, less than 10°.

Figure 2G:
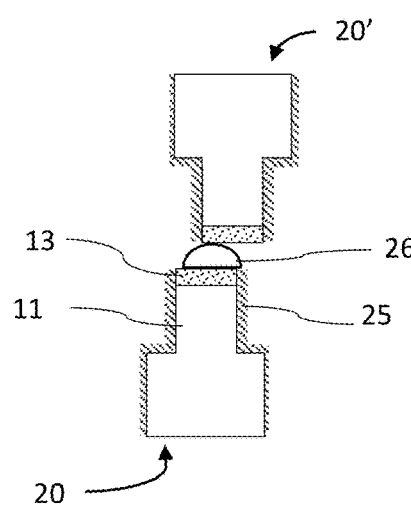
Figure 2H:
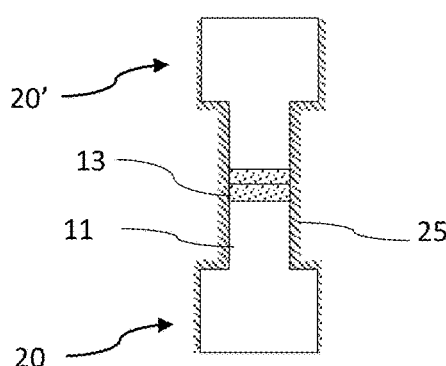

FIG. 2G and FIG. 2H illustrate the steps respectively identical to steps 1G and 1H. These steps correspond to the transfer and bonding of a chip 20 made by the process of FIGS. 2A to 2F, on a structure having a host surface with a similar hydrophilicity contrast, for example on another chip 20' made by the same process.

An advantage of the embodiment of FIGS. 2A to 2H is that it enables better control of the surface state of layer 13. This reduces the defectiveness of the bonding and enables a surface of well controlled hydrophilicity to be obtained. Another advantage is the absence of degradation of the hydrophobic layer 25 during removal of resin layer 19, enabling the hydrophilic/hydrophobic contrast to be improved and facilitating self-alignment. Furthermore, this process enables the list of available hydrophobic materials to be enlarged given that it is no longer necessary to choose a material resistant to the chemical cleaning used when removing layer 19.

Another advantage of this embodiment is that substrate 27 can be recycled and used again at the end of the process (according to the process used for removing substrate 27).

Yet another advantage of this embodiment is that the cutting described in relation to FIG. 2D can be carried out by plasma etching, which reduces particle and metal contamination compared with mechanical cutting, for example with a diamond saw. Cutting by laser is also possible with the same advantages.

FIG. 3A, FIG. 3B, FIG. 3C and FIG. 3D are cross sectional views, illustrating partially and schematically the successive steps of a manufacturing process followed by assembly of two structures by bonding according to a second embodiment.

More specifically, in this embodiment, a first structure obtained by the steps of FIGS. 2A to 2F is assembled with a second structure obtained by a similar process but differing in that it has not undergone the step of cutting to form the individual chips 20.

Figure 3A:
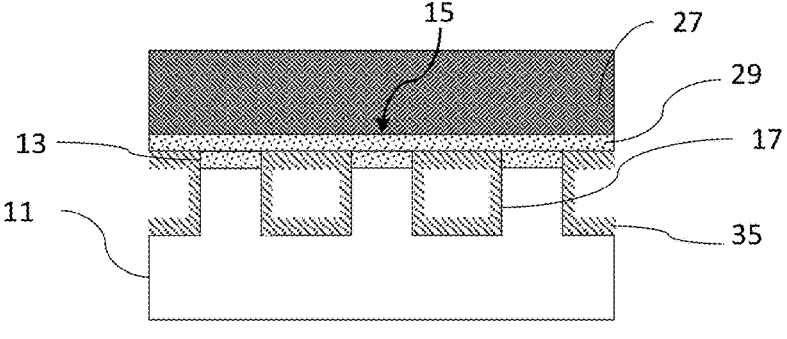
FIG. 3A, FIG. 3B, FIG. 3C and FIG. 3D are cross sectional views, partially and schematically illustrating the successive steps of a manufacturing process followed by assembly of two structures by bonding according to a second embodiment.

To make this second structure, a hydrophobic layer 35 is first deposited on the back face of the structure illustrated in FIG. 2C thereby obtaining the structure illustrated in FIG. 3A. This step is similar to the step of depositing layer 25 differing in that layer 35 is formed on the structure illustrated in FIG. 2C and not on the structure illustrated in FIG. 2D.

Figure 3B:
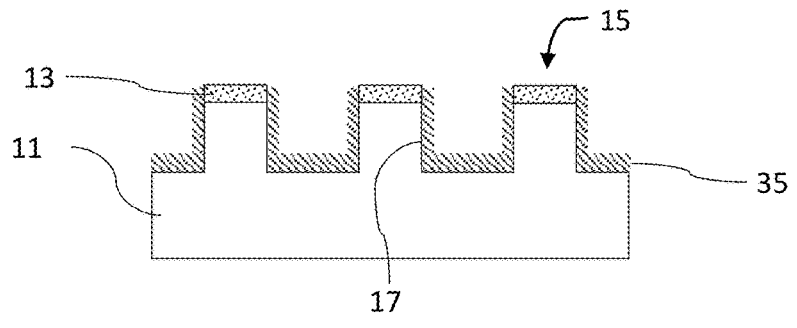

At the end of this step, in a second stage, substrate 27 and layer 29 are removed to form the structure illustrated in FIG. 3B similarly to what has been described in relation to FIG. 2F.

The structure illustrated in FIG. 2F and the structure illustrated in FIG. 3B are then assembled and self-aligned by confined water.

Figure 3C:
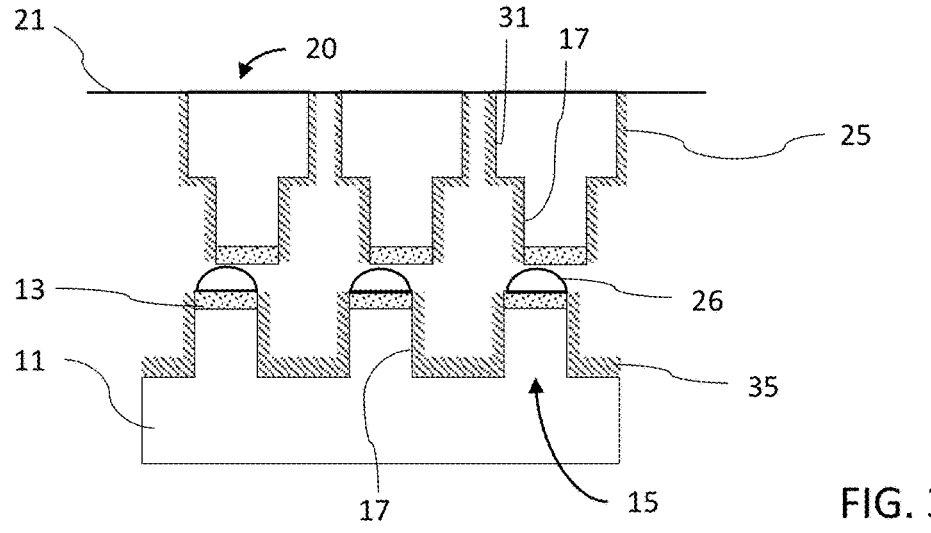
Figure 3D:
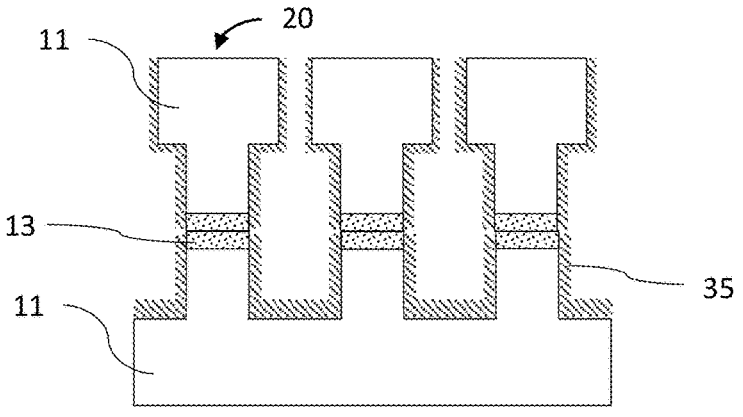

FIG. 3C shows a structure obtained after depositing water droplets 26 on the surface of the pads 15 of the structures illustrated in FIG. 3B and the transfer to it of the structure illustrated in FIG. 2F, with the layers 13 of the two structures facing each other. FIG. 3D shows a structure obtained after bonding these two structures.

These steps are similar to those described on the scale of a chip in relation to FIGS. 2G and 2H, they will not therefore be described again in what follows.

FIG. 4A, FIG. 4B, FIG. 4C, FIG. 4D, FIG. 4E and FIG. 4F are cross sectional views, partially and schematically illustrating the successive steps of a manufacturing process followed by assembly of two structures by bonding according to a third embodiment.

The third embodiment is similar to the first embodiment illustrated in relation to FIGS. 2A to 2H but differing in that the starting substrate 11 is a so-called SOI (Semiconductor On Insulator) substrate.

The process described in FIGS. 4A to 4F comprises steps similar to some of the steps in the process described in relation to FIGS. 2A to 2H. These steps will not be detailed again in what follows. Only differences from the process of FIGS. 2A to 2H will be highlighted.

Figure 4A:
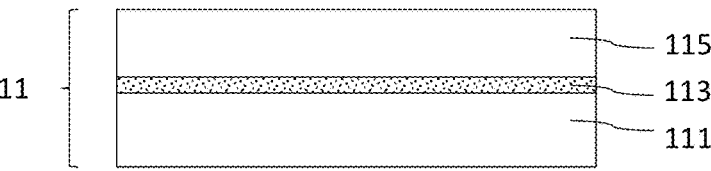
FIG. 4A, FIG. 4B, FIG. 4C, FIG. 4D, FIG. 4E and FIG. 4F are cross sectional views, partially and schematically illustrating the successive steps of a manufacturing process followed by assembly of two structures by bonding according to a third embodiment.

FIG. 4A illustrates a starting substrate 11 comprising an oxide layer 113, for example silicon dioxide, between two semiconductor levels, for example of silicon. Substrate 11 comprises a lower semiconductor level or semiconductor layer 111 and an upper semiconductor level or semiconductor layer 115. The upper semiconductor level 115 has, for example, a thickness between 5 μm and 20 μm, for example of the order of 10 μm. The silicon dioxide layer has, for example, a thickness between 0.2 μm and 5 μm, for example of the order of 1 μm. The lower semiconductor level 111 has, for example, a thickness between 100 μm and 1 mm, for example between 500 μm and 800 μm, for example of the order of 725 μm.

Figure 4B:
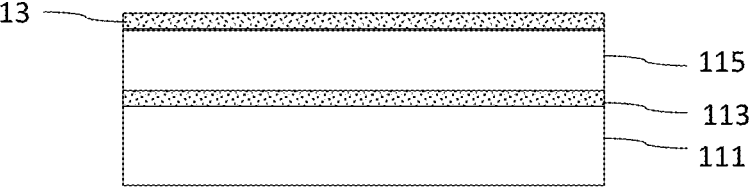

FIG. 4B illustrates a structure obtained at the end of a step of depositing a layer 13 on the upper face of substrate 11 in a similar way to what has been described in relation to the first embodiment in FIG. 2A but differing in that substrate 11 is an SOI substrate.

Figure 4C:
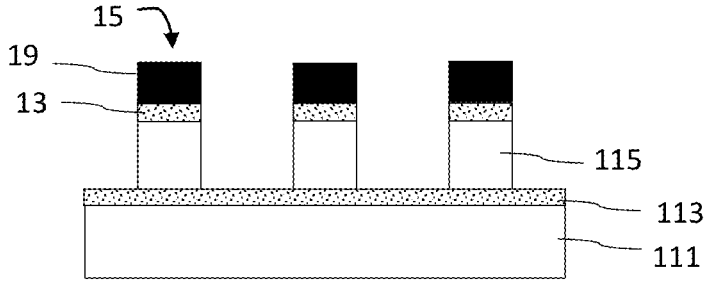

FIG. 4C illustrates a structure obtained at the end of a step of forming pads 15 in the structure of FIG. 4B. This step is similar to what has been described in relation to the first embodiment in FIG. 2A but differing in that the layer 113 plays a role of etching barrier layer. Thus, the height of the pads 15 is set by the thickness of the upper semiconductor level 115 of the SOI substrate.

Figure 4D:
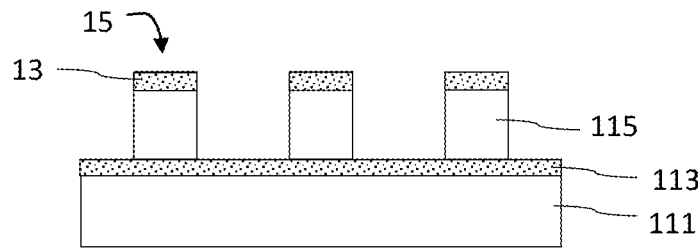

FIG. 4D illustrates a structure obtained at the end of a step to remove layer 19 from the structure illustrated in FIG. 4C. This step is similar to what has been described in relation to the first embodiment in FIG. 2B.

Figure 4E:
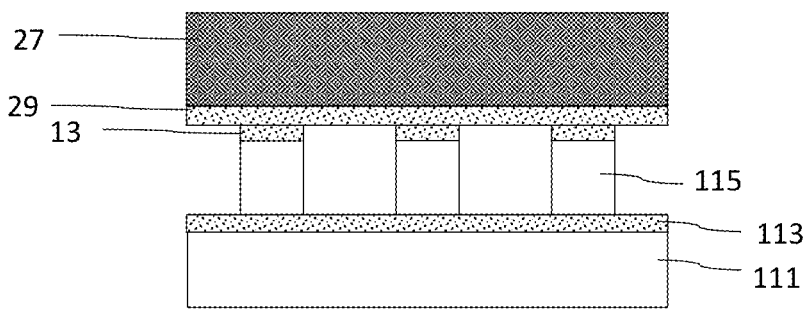

FIG. 4E illustrates a structure obtained at the end of a step of transferring a substrate 27 and a layer 29 to the upper face of the structure illustrated in FIG. 4D. This step is similar to what has been described in relation to the first embodiment in FIG. 2C.

Figure 4F:
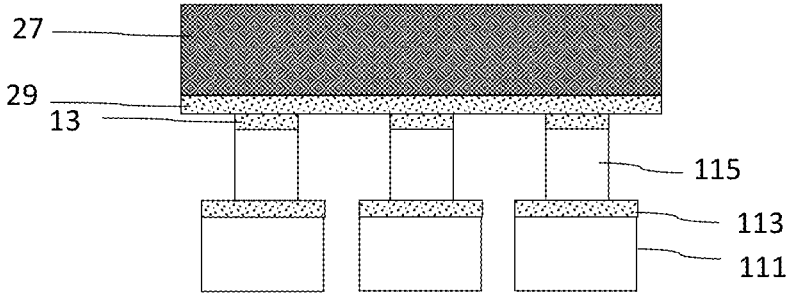

FIG. 4F illustrates a structure obtained at the end of a step of forming trenches 23. The step to form the trenches 23 described in this embodiment is similar to the step to form trenches 23 described in relation to the first embodiment in FIG. 2D, but differing in that it is carried out in two steps and that it comprises, in addition to the etching of substrate 11, another etching that allow the etching of layer 113. During the first step, only the lower level 111 of the SOI substrate is etched, layer 113 serving as an etching stopping layer. This limits damage to the substrate 27.

At the end of this step, similar steps to those of FIGS. 2E to 2G are carried out starting from the Figure illustrated in FIG. 4F.

Figure 5A:
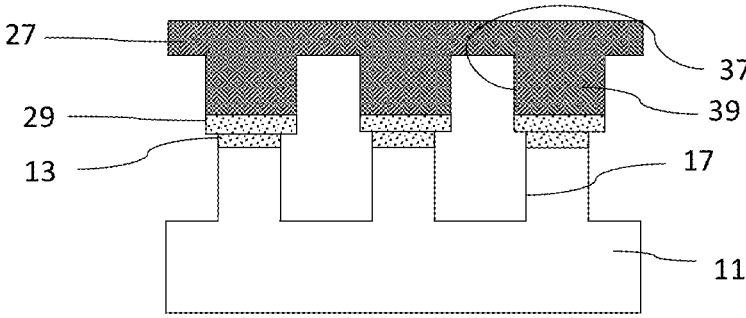
FIG. 5A and FIG. 5B are cross sectional views, partially and schematically illustrating the successive steps of a process for the assembly of two structures by bonding according to a fourth embodiment.
Figure 5B:
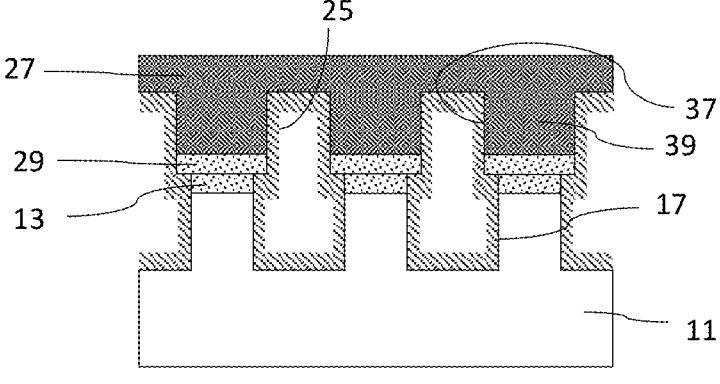

FIG. 5A and FIG. 5B are cross sectional views, illustrating partially and schematically the successive steps of a process for the fabrication then assembly of two structures by bonding according to a fourth embodiment.

FIG. 5A illustrates a structure similar to the structure illustrated in FIG. 2C but differing in that substrate 27 comprises the trenches 37, formed on the lower face in the orientation of FIG. 5A. Indeed, before the step to transfer structure 27 and layer 29 to the structure illustrated in FIG. 2B, the assembly formed by substrate 27 and layer 29 is structured, for example, by etching so as to form the trenches 37 delimiting the pads 39. As an example, the trenches 37 are non-traversing and extend, for example, from the lower face of layer 29, into the layer and into a part of substrate 27. As an example, the pads 39 has the same repeat pitch (distance centre to centre of two neighbouring pads) as the pads 15. As an example, the pattern formed by the pads 39 in substrate 27 is symmetrical with the pattern formed by the pads 15 in substrate 11, with reference to a plane parallel to the back faces of substrates 11 and 27 and passing between the two substrates. As an example, the trenches 37 extend to a depth between 50 μm and 600 μm, for example between 200 μm and 400 μm, for example of the order of 300 μm.

FIG. 5B illustrates a structure obtained at the end of a step of depositing the hydrophobic layer 25. This step is similar to what has been described in relation to FIG. 3A.

At the end of this step, similar steps to those of FIGS. 3B to 3D are carried out starting from the stage of the Figure illustrated in FIG. 5B.

An advantage of this embodiment lies in the fact that the presence of the trenches 37 facilitates circulation and the homogeneous depositing of the hydrophobic material during the formation of layer 25. This is particularly advantageous when the pads 15 are of low thickness.

In the example represented, the pads 39 have a surface area greater than the pads 15. Thus, the upper face of each pad 15 is entirely covered by the underlying pad 39 during hydrophobic treatment, so the hydrophobic material is formed only on the sides of the pads 15.

As a variant, the pads 39 have a surface area smaller than the pads 15. Thus, only a central part of the upper face of each pad 15 is covered by the underlying pad 39 during hydrophobic treatment. The hydrophobic material is then formed on the sides of the pads 15 and on the surrounding part of the upper face of the pads 15.

It is furthermore noted that in this embodiment, the trenches 17 may be omitted. In that case, the thickness of the pads 15 is nil. The surface area of each pad 15 then corresponds to the total surface area of the chip 20 at the end of the cutting step. If the hydrophobic treatment is applied before cutting (i.e. before the formation of the trenches 31), the pads 39 preferably have a surface area less than that of the pads 15. As a result, only a central part of the upper face of each pad 15 is covered by the underlying pad 39 during hydrophobic treatment. The hydrophobic material is then formed only on the surrounding part of the upper face of the pads 15. If the hydrophobic treatment is applied after cutting (i.e. after the formation of the trenches 31), the pads 39 may have a surface area less than or greater than that of the pads 15.

Various embodiments and variants have been described. Those skilled in the art will understand that certain features of these embodiments can be combined and other variants will readily occur to those skilled in the art. In particular, the embodiments described are not limited to the embodiment of materials and the dimensions mentioned in this description. Thus, the embodiments of FIGS. 3, 4 and 5 may be combined.

In addition, the embodiments have been described for hydrophilic bonding, but they may be used for hydrophobic bonding. In other words, instead of providing a structure with a front hydrophilic surface, the front face of the structure can be hydrophobic, provided that the layer 25 or 35 deposited on the sides of the structure is more hydrophobic than the front face.

To this effect, an example (non-limiting) of hydrophobic bonding will now be described. In this example, we propose to make a structure similar to the structure illustrated in FIG. 2B but differing in that it does not comprise a layer 13. At the end of the step to clean the upper face of the pads 15, we propose a new cleaning step to deoxidize the surface of the pads 15. To do this, a treatment based on HF vapor or gas is applied. At the end of this cleaning, the upper face of the pads 15 has a droplet angle, for a water droplet, of the order of 70°. In this example, a substrate 27 is also transferred to the upper face of the pads 15, but with the difference that the lower face of the substrate 27 is not covered with a layer of oxide 27 as has been described in relation to the first embodiment. In this example, before transferring the substrate 27 to the upper face of the pads 15, the lower face of the substrate 27 is cleaned in the same way to deoxidize the surface. Following the transfer of the substrate intended to protect the front face of the chips, steps similar to those described in relation to FIGS. 2D to 2H are carried out. The bonding of two chips formed by this process is then said to be hydrophobic since the front faces of the chips are hydrophobic. In this example, the front faces of the chips have a droplet angle, for a water droplet, of the order of 700 and the sides of the chips have a droplet angle, for a water droplet, of the order of 110°. In this case, the difference in hydrophilicity is around 400 droplet angle. More generally, this process can be used for manufacturing chips intended for bonding by water confinement, if the difference in hydrophilicity between its front face and its sides is greater than 20°, for example greater than 30°, for example greater than 400 droplet angle, for a water droplet.

As a variant, the front face of substrate 11 and that of substrate 27 can be made hydrophobic by depositing a hydrophobic layer, for example less hydrophobic than layer 25. As an example, a layer of silicon can be deposited, for example with a thickness of the order of 5 nm, on the front face of substrate 11 and of substrate 27. In this variant, the hydrophobic layer deposited on the front face of substrate 11 and substrate 27 is, for example, cleaned with a mixture of sulfuric acid and hydrogen peroxide in the proportion of 10 to 1, then rinsed and cleaned again with a mixture at 50° C. of water, ammonia and hydrogen peroxide in the proportion of one to five to five.

In addition, in the present description, the bonding is by water droplet confinement. However, the bonding may be by confinement of a droplet of another liquid.

Furthermore, in the description we consider a bonding of two chips, but it may be generalized to the bonding of any two structures whether electronic or not.

Finally, the practical implementation of the embodiments and variants described herein is within the capabilities of those skilled in the art based on the functional description provided hereinabove.

The invention claimed is:

1. A manufacturing method for a structure intended to be assembled with another structure by self-aligning bonding by hydrophilic contrast, comprised of the following successive steps:
   a) definition of pads on the side of a first face of a first substrate;
   b) transfer of a second substrate on the side of the first face of the first substrate;
   c) deposition, on the sides and/or on a surrounding part of the upper face of the pads of a material more hydrophobic than a material of the upper face of the pads;
   d) removal of the second substrate; and in which the material of the upper face of the pads and the material coating the side of the pads have a difference in water droplet contact angle greater than 20°.

2. The manufacturing method according to claim 1 in which the first substrate comprises a semiconductor material.

3. The manufacturing method according to claim 2, in which the first substrate is a substrate of a semiconductor on insulator type.

4. The manufacturing method according to claim 1, in which the first face of the first substrate is coated with a layer of oxide.

5. The manufacturing method according to claim 4, in which the oxide layer on the first substrate comprises pads for metallic connections.

6. The manufacturing method according to claim 1, in which, at step b), the second substrate is fixed to the first substrate by molecular bonding.

7. The manufacturing method according to claim 1, in which step c) is carried out by treatment with HF vapor.

8. The manufacturing method according to claim 1, in which step c) is carried out by immersing the structure in a bath based on a fluorinated compound.

9. The manufacturing method according to claim 1, which comprises, before step c), a step of cutting the first substrate to form chips, each chip comprising a pad.

10. The manufacturing method according to claim 1, which comprises, after step a), a step of cleaning the first face of the first substrate.

11. The manufacturing method according to claim 1, in which the second substrate is structured so as to have a pad of non-zero thickness in line with each pad of the first substrate.

12. The manufacturing method according to claim 1, in which the pads of the first substrate have a non-zero thickness.

13. A method for bonding a first structure and a second structure made by the process described according to claim 1, comprising a step in which a droplet of water on the first face of the first substrate of the first structure and a step in which the second structure is transferred to the first structure, the first faces of the first substrates facing opposite other.

* * * * *